(12) United States Patent
Delehouze et al.

(10) Patent No.: US 11,932,942 B2
(45) Date of Patent: Mar. 19, 2024

(54) METHOD AND DEVICE FOR DEPOSITING A COATING ON A CONTINUOUS FIBRE

(71) Applicants: SAFRAN CERAMICS, Le Haillan (FR); CENTRE NATIONAL DE LA RECHERCHE SCIENTIFIQUE, Paris (FR); UNIVERSITE DE BORDEAUX, Bordeaux (FR)

(72) Inventors: Arnaud Delehouze, Moissy-Cramayel (FR); Eric Bouillon, Moissy-Cramayel (FR); Adrien Delcamp, Moissy-Cramayel (FR); Cédric Descamps, Moissy-Cramayel (FR)

(73) Assignees: SAFRAN CERAMICS, Le Haillan (FR); CENTRE NATIONAL DE LA RECHERCHE SCIENTIFIQUE, Paris (FR); UNIVERSITE DE BORDEAUX, Bordeaux (FR)

( * ) Notice: Subject to any disclaimer, the term of this patent is extended or adjusted under 35 U.S.C. 154(b) by 0 days.

(21) Appl. No.: 17/842,205

(22) Filed: Jun. 16, 2022

(65) Prior Publication Data

US 2022/0316068 A1 Oct. 6, 2022

Related U.S. Application Data

(62) Division of application No. 16/958,011, filed as application No. PCT/FR2018/053480 on Dec. 20, 2018, now Pat. No. 11,390,952.

(30) Foreign Application Priority Data

Dec. 26, 2017 (FR) ...................................... 1763217

(51) Int. Cl.
*C23C 16/54* (2006.01)
*C04B 35/628* (2006.01)
(Continued)

(52) U.S. Cl.
CPC ...... *C23C 16/545* (2013.01); *C04B 35/62863* (2013.01); *C04B 35/62868* (2013.01);
(Continued)

(58) Field of Classification Search
CPC ..... C23C 16/545; C23C 16/26; C23C 16/325; C23C 16/342; C23C 16/46; C23C 16/345;
(Continued)

(56) References Cited

U.S. PATENT DOCUMENTS 3,850,689 A * 11/1974 Basche .................. C03C 25/42
65/448
4,970,093 A 11/1990 Sievers et al.
(Continued)

FOREIGN PATENT DOCUMENTS

| EP | 2 636 918 A | 9/2013 | |
| FR | 3044023 A1 * | 5/2017 | ............. B32B 17/02 |
| JP | 2002-252493 A | 9/2002 | |

OTHER PUBLICATIONS

Machine translation, FR 3044023 description (Year: 2017).*
(Continued)

*Primary Examiner* — Michael G Miller
(74) *Attorney, Agent, or Firm* — Pillsbury Winthrop Shaw Pittman LLP

(57) ABSTRACT

A process for depositing a coating on a continuous fibre of carbon or silicon carbide from a precursor of the coating, includes heating a segment of the fibre in the presence of the coating precursor in a microwave field so as to bring the surface of the segment to a temperature allowing the coating to form on the segment from the coating precursor, wherein the segment of fibre is in the presence of a supercritical phase of the precursor of the coating in the reactor and the coating is formed by supercritical phase chemical deposition in the reactor.

2 Claims, 2 Drawing Sheets

(51) Int. Cl.
*C04B 35/80* (2006.01)
*C23C 16/26* (2006.01)
*C23C 16/32* (2006.01)
*C23C 16/34* (2006.01)
*C23C 16/46* (2006.01)

(52) U.S. Cl.
CPC .. *C04B 35/62873* (2013.01); *C04B 35/62884* (2013.01); *C04B 35/80* (2013.01); *C23C 16/26* (2013.01); *C23C 16/325* (2013.01); *C23C 16/342* (2013.01); *C23C 16/46* (2013.01); *C04B 2235/5244* (2013.01); *C04B 2235/5248* (2013.01)

(58) Field of Classification Search
CPC ............ C23C 16/481; C04B 35/62863; C04B 35/62868; C04B 35/62873; C04B 35/62884; C04B 35/80; C04B 2235/5244; C04B 2235/5248; C04B 2235/5264; C04B 2235/667
See application file for complete search history.

(56) References Cited

U.S. PATENT DOCUMENTS

| | | | |
|---|---|---|---|
| 5,543,605 A | * | 8/1996 | Kimrey, Jr. ....... C04B 35/62884 219/693 |
| 5,547,717 A | | 8/1996 | Scaringella |
| 6,152,072 A | | 11/2000 | Barmatz et al. |
| 2011/0171399 A1 | | 7/2011 | Brun et al. |
| 2016/0237595 A1 | | 8/2016 | Maxwell |

OTHER PUBLICATIONS

International Search Report as issued in International Patent Application No. PCT/FR2018/053480, dated Apr. 4, 2019.
Search Report as issued in French Patent Application No. 2007090, dated Jun. 4, 2021.
First Office Action as issued in Chinese Patent Application No. 2018800814059, dated Dec. 3, 2021.
"Common Knowledge," (4) U-shaped tubular reactor, Mar. 31, 2013, 4 pages, w/ English translation of relevant portion.

* cited by examiner

METHOD AND DEVICE FOR DEPOSITING A COATING ON A CONTINUOUS FIBRE

CROSS-REFERENCE TO RELATED APPLICATIONS

This application is a divisional of U.S. application Ser. No. 16/958,011 filed on Jun. 25, 2020, which is the U.S. National Stage of PCT/FR2018/053480, filed Dec. 20, 2018, which in turn claims priority to French patent application number 1763217 filed Dec. 26, 2017. The content of these applications are incorporated herein by reference in their entireties.

FIELD

The present invention relates to the general field of processes for depositing a coating on fibres, and more particularly on a continuous carbon or silicon carbide fibre from a precursor of the coating.

BACKGROUND

Ceramic matrix composite (CMC) materials, known for their good mechanical properties that make them suitable for use as structural elements and for maintaining these properties at high temperatures, are a viable alternative to traditional metal parts. Their reduced mass compared to their metallic equivalent makes them the ideal choice to respond to the problems of increasing efficiency and reducing polluting emissions from engines in the aeronautical field.

Parts made of CMC material comprise a generally continuous fibrous reinforcement in the form of a woven textile, which is densified by a ceramic matrix. The fibrous reinforcement thus comprises continuous long fibres, usually in the form of yarns or strands, whose orientation can be adapted to the main directions of stress of the part during use. The preform to form the fibre reinforcement must be woven from the continuous fibre strands to the dimensions of the part (for example by two- or three-dimensional weaving) using a suitable loom. In order to produce a part made of CMC material with improved mechanical properties, it is known to have fibres in the fibrous preform which are coated with an interphase prior to densification of the preform.

The deposition of an interphase coating on the fibres of a fibrous preform already woven by chemical vapour infiltration (CVI) is known. In addition to the high cost and low kinetics of this technique, the interphase formed on the fibres is generally not homogeneous and there are strong gradients in interphase thickness between the surface and the core of the preform, and locally between the fibres located on the surface and in the core of the yarn or strand. This inhomogeneity of the deposition within the preform has consequences on the final mechanical properties of the densified part, which is undesirable.

There is therefore a need for a process for depositing a coating on a continuous carbon or silicon carbide fibre that is fast and forms a homogeneous coating.

SUMMARY

The principal purpose of the present invention is therefore to overcome such disadvantages by providing a process for depositing a coating on a continuous carbon or silicon carbide fibre from a precursor of the coating, the process comprising at least heating a segment of the fibre in the presence of the precursor of the coating in a microwave field so as to bring the surface of the segment to a temperature enabling the coating to be formed on the segment from the precursor of the coating.

A "fibre segment" here corresponds to a certain length of fibre, in other words, the segment extends along the length or longest dimension of the fibre. Since a fibre may consist of several filaments, a fibre segment may consist of several filaments. In the present disclosure, "segment area" refers to the area of each filament, if any, that makes up the fibre segment. Similarly, "deposit" or "form" a coating on the fibre segment means the deposition or formation of the coating on the surface of each filament that comprises the fibre segment, where applicable.

The process according to the invention is remarkable in particular by the fact that a segment of the continuous fibre is heated by direct coupling via microwaves. Indeed, the inventors have observed that the segment of long carbon or silicon carbide fibre couples with a microwave field, which makes it possible to bring its surface to a temperature sufficient to form the coating from a precursor of the coating. This arrangement makes it possible to heat the fibre segment as a whole, and in particular its surface, and to ensure homogeneous and rapid formation of the coating thereon. A further advantage of the process according to the invention is that the precursor of the coating can also couple with the microwave field, thereby increasing its temperature and improving both the kinetics of forming the coating and its homogeneity. Another advantage of the invention is the reduction of the energy required to form the coating, as the fibre segment is heated directly instead of an entire reactor. Finally, thanks to the versatility of the process according to the invention, the fibre can be brought into contact with the precursor in the liquid phase, in the gas phase, or in the supercritical phase.

"Microwave field" means an electromagnetic field with a frequency between several hundred MHz and several GHz. The microwave field can be characterized by its power (or amplitude) and frequency, which can be easily determined by the person skilled in the art to obtain a surface temperature of the short fibres sufficient to form the coating. There is indeed a multiplicity of frequency/power combinations that allow sufficient coupling between the fibre segment and the microwave field.

In an example embodiment, the microwave field has a main frequency between 2.35 GHz and 2.55 GHz.

In an example embodiment, during the heating step, the fibre segment may be in contact with a liquid phase of the coating precursor and the coating is formed by heat treatment. In this configuration, the liquid phase of the precursor can couple with the microwave field, which increases its temperature, reduces heat dissipation around the fibre segment and thus improves the kinetics of the calefaction.

In an example embodiment, during the heating step, the fibre segment may be in the presence of a gas phase of the coating precursor and the coating may be formed by chemical vapour infiltration. Compared to the processes of the prior art using a gaseous precursor and CVI deposition, this example embodiment of the process according to the invention improves the formation kinetics and the homogeneity of the coating.

In an example embodiment, the gaseous phase of the coating precursor can be obtained by boiling a liquid phase of the coating precursor, the boiling resulting from the contact between a hot portion of the fibre contiguous to the segment present in the microwave field and the liquid phase of the coating precursor. The portion of the fibre contiguous to the coating is, in this situation, heated by conduction from the fibre segment present in the microwave field. This technique allows the coating to be formed on the fibre segment at a reduced pressure, equal to or slightly above atmospheric pressure. In addition, the wall of the reactor in which the deposition is carried out is said to be cold compared to a CVI reactor in which the reactor walls must be heated, making the process easier to implement and more energy-efficient. This deposition technique can be seen as a hybrid technique between calefaction and chemical vapor infiltration.

In an example embodiment, during the heating step, the fibre segment may be in the presence of a supercritical phase of the coating precursor and the coating is formed by supercritical phase chemical deposition.

In an example embodiment, when heating the fibre segment, the segment may be in a first position, and the process may further include the fibre being moved to a second position in which the segment is out of the microwave field. In other words, the process may include a step of moving the continuous fibre into the microwave field. This advantageous arrangement makes it easier to form the coating along the entire length of the fibre.

In this case, the fibre can be run continuously or semi-continuously, depending on the deposition kinetics inherent to the variants described above and the precursors involved.

In an example embodiment, when a liquid phase of the precursor is used, the fibre segment can be in contact with the liquid phase of the coating precursor when it is in the second position. This means that the fibre moves in a direction in which it dips into the liquid phase once it has been heated. This arrangement is advantageous because it makes it possible, on the one hand, to quickly stop the formation of the deposit on the surface of the filaments constituting the fibre segment and, on the other hand, to quench the fibre segment just after the coating has been formed on the latter, thus ensuring homogeneity of the coating between two successive segments, and thus over the whole of the continuous fibre.

In an example embodiment, the fibre unwinding may involve the unwinding of the fibre from a first mandrel and the winding of the fibre onto a second mandrel.

In an example embodiment, the coating can be an interphase coating. The interphase has a defragilisation function of the composite material which promotes the deflection of possible cracks reaching the interphase after having propagated in the matrix, preventing or delaying the rupture of fibres by such cracks. This interphase also protects the fibre of the matrix material during its formation.

In particular, the coating may include pyrolytic carbon (PyC), boron nitride (BN) or silicon carbide (SiC). The interphase coating may, for example, include $Si_3N_4$ or SIBN.

In an example embodiment, the fibre can be made of silicon carbide with an oxygen content of less than or equal to 1 atomic percent. For example, such a fibre may be a Hi-Nicalon type S fibre marketed by the Japanese company NGS.

The invention also relates, according to a second aspect, to a device for carrying out a process for depositing a coating on a continuous fibre from a precursor of the coating in the liquid phase, in the gas phase or in the supercritical phase, the device comprising a microwave generator configured to generate a microwave field, a reactor configured to be traversed by the continuous fibre and to contain the precursor of the coating, at least part of said reactor being intended to be in the microwave field of the microwave generator, and a device for feeding the fibre inside the reactor. The fibre feeding device may be preferentially located outside the microwave field. Care can be taken to ensure that the portion of the reactor in the microwave field is present within a belly of the microwave field.

In an example embodiment, the reactor can be roughly U-shaped. The reactor can be a tube. In this case, only part of a branch or vertical part of the reactor may be present in the microwave field.

In an example embodiment, especially when the reactor is U-shaped, the reactor may include at least one fibre centring element in the reactor. A centring element may be present at the entrance and/or exit of the reactor. In a U-shaped reactor, two centring elements may be present in the reactor at the junctions between the horizontal and vertical portions of the U.

In an example embodiment, the traversing device may comprise a first mandrel from which the fibre is to be unwound and a second mandrel on which the fibre is to be wound.

In an example embodiment, the microwave field can be obtained using a resonator with a resonant cavity. In this case, the only parameter to be set to modulate the surface temperature of the fibres is the power supplied to the resonator, as the resonator usually has a fixed resonant frequency. Care can be taken that the continuous fibre and the precursor of the coating are placed within a belly of the microwave field, which is the case when such a resonator is used and the fibre and precursor are placed in the centre of its resonant cavity. Of course, other means of generating microwaves can be used.

BRIEF DESCRIPTION OF THE DRAWINGS

Other features and advantages of the present invention will be apparent from the description given below, with reference to the appended drawings which illustrate example embodiments without any restrictive character. On the figures.

DETAILED DESCRIPTION

Figure 1:
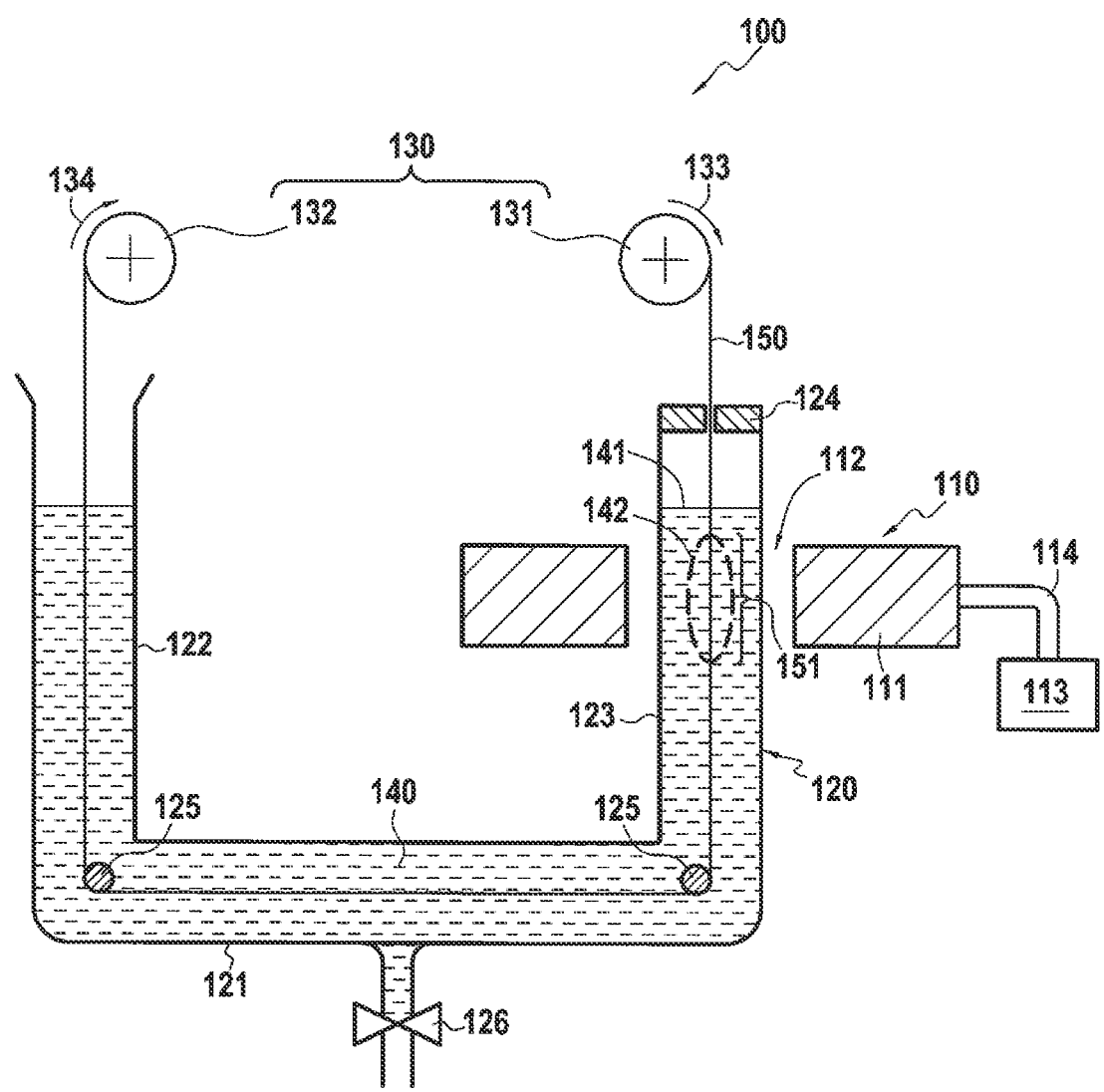
FIG. 1 shows a very schematic example of a device enabling a process to be implemented according to a first embodiment of the invention.

FIG. 1 shows a device 100, the subject matter of the invention, for carrying out a process according to a first embodiment of the invention called calefaction, i.e. in which the formation of the coating is carried out in the presence of a liquid phase of a precursor of the coating. The device 100 comprises a microwave generator 110, a reactor 120, and a traversing device 130.

The microwave generator 110 here consists of a resonator 111 with a resonant cavity 112, resonator 111 is connected to a wave generator 113 by a coaxial cable 114. During operation, a microwave field passes through the resonant cavity 112.

The reactor 120 can be made of a material transparent to microwaves, for example quartz. The reactor 120 here takes the form of a U-tube with a horizontal section 121, a first vertical section 122 and a second vertical section 123. The second vertical part 123 of the reactor 120 is here present at least partly in the resonant cavity 112 of the resonator 111, i.e. it passes through the resonator 111.

The reactor 120 here contains a precursor of the coating 140 in the liquid phase. In this example, the meniscus 141 of the precursor 140 is located above the cavity 112 of the resonator 111. In other words, the part of the reactor 120 that is present in the cavity 112 is filled with the liquid phase of the precursor 140.

The reactor 120 is here plugged at the end of the second vertical part 123 by a plug 124 pierced with a central hole so that a continuous carbon or silicon carbide fibre 150 can pass through it. The plug 121 also acts here as a centring element for the fibre 150 in the reactor. The plug 121 can be provided to allow the fibre 150 to be fed into the reactor 120. The reactor 120 is also equipped with two centring elements 125 present respectively at the two junctions between the horizontal part 121 and the two vertical parts 122 and 123 of the reactor 120. The centring elements 124 may take the form of small rollers with a groove (not visible in the figures) whose function is to keep the fibre 150 centred in the reactor 120. The centring elements 124 and 125 may have a specific shape to allow spreading of the fibre in order to improve the homogeneity of the deposition on the filaments present in the fibre, if any. The centring elements 124 are present inside the reactor 120. The centring elements 124 are thus also centring elements of the fibre 150 in the reactor 120.

In the example shown, the reactor 120 can be provided with a bleed valve 126 and means (not shown) to supply the precursor of the coating 140 to the reactor and maintain a constant level of the latter in the reactor 120.

Here the traversing device 130 comprises a first mandrel 131 from which the fibre 150 can be unwound, the first mandrel 131 can be a storage mandrel for the fibre 150 before it is coated, and a second mandrel 132 on which the fibre 150 can be wound after it is coated. The fibre 150 can then be circulated in the reactor 120 from the first mandrel 131 to the second mandrel 132. The centring elements 124, 125 of the fibre 150 in the reactor 120 ensure here that the fibre 150 does not touch the wall of the reactor 120 and that it is taut. The traversing device 130 can be controlled by control means not shown, so that the fibre 150 is taken off continuously or semi-continuously (i.e. step by step) into the device 100. The traversing device 130 can traverse the fibre 150 in the device 100 in both directions.

A first embodiment of the process according to the invention will now be described in connection with this device 100. When the microwave generator 110 is in operation, a microwave field is created in the cavity 112. The traversing device 130 can advance the fibre 150 in the device over a certain distance so that a segment 151 of the fibre 150 is in the cavity 112. As a result of the coupling between the fibre 150 and the microwave field, the fibre segment 151 present in a dotted area 142 shown in FIG. 1 (this area being located inside the cavity) is heated, and in particular the surface of the heated fibre segment 151 reaches a temperature sufficient for the precursor of the liquid phase coating 140 to vaporize locally around the fibre segment 151 and to deposit on the fibre segment 151 by calefaction to form the coating. As mentioned above, the skilled person knows how to select the properties of the microwave field, in particular its frequency and/or power, to reach the calefaction temperature of the precursor 140.

In the example shown, the traversing device 130 traverses the fibre 150 through the device 100 in the direction indicated by the arrows 133 and 134. Specifically, the fibre 150 is here running so that a segment 151 that has just passed through the microwave field continues its path inside precursor 140 in the liquid phase. This arrangement makes it possible, on the one hand, to quickly stop the formation of the deposit on the surface of the filaments constituting the fibre segment and, on the other hand, to harden the fibre segment on which the coating has just been formed, and ensures homogeneity of coating formation over the whole of the fibre 150. Of course, it is also possible to run the fibre 150 in a direction opposite to that shown. The coated fibre 150 is then recovered at the end of the first vertical part 122 of the reactor 120 by the second mandrel 132 which can, for example, store it for later use. Alternatively, the coated fibre 150 can be directly used to make a fibrous preform, for example by weaving.

Figure 2:
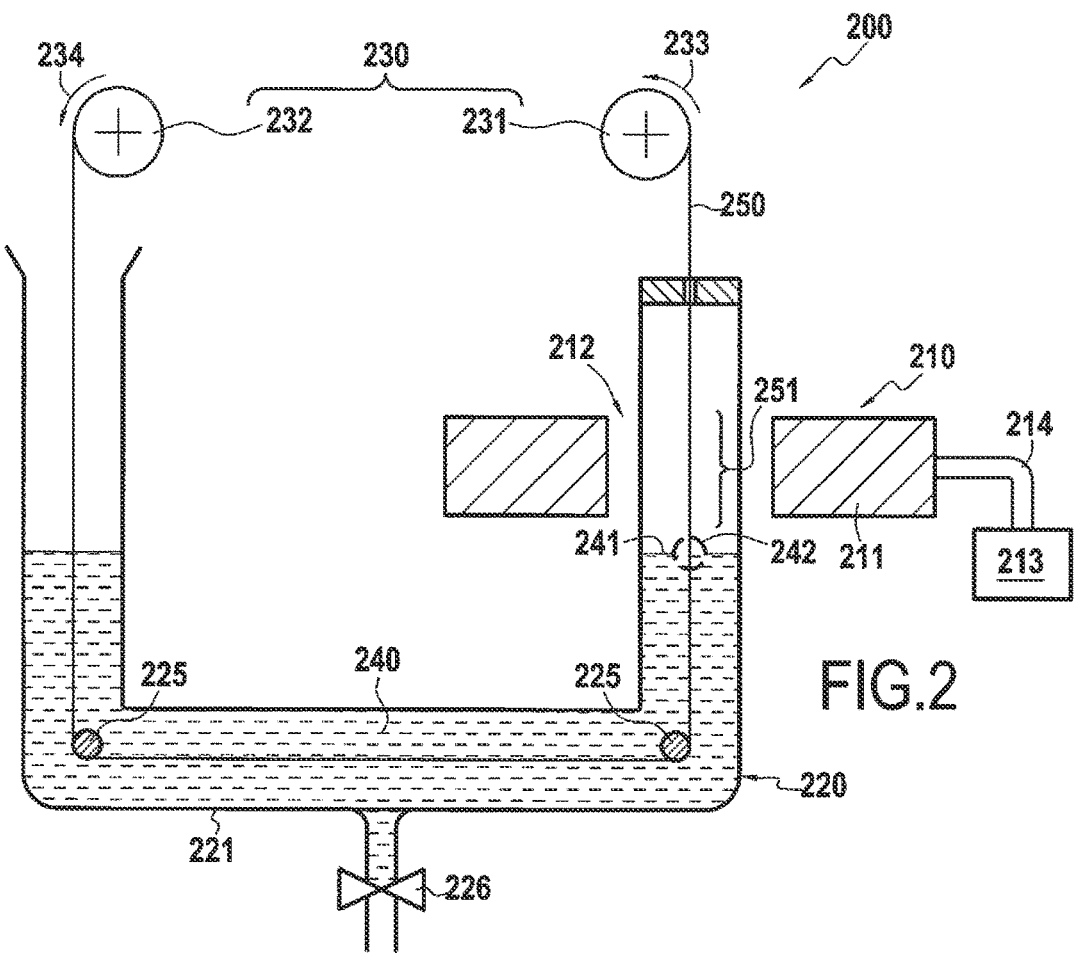
FIG. 2 shows the device of FIG. 1 in a configuration enabling a process to be carried out according to a second embodiment of the invention.

FIG. 2 shows a device 200 similar to the device 100 in FIG. 1 in a configuration enabling a process to be carried out according to a second embodiment of the invention. In this embodiment, the fibre segment 251 is heated by the microwave field in the presence of a gaseous phase of the coating precursor obtained by boiling a liquid phase of said precursor. Unless otherwise stated, the corresponding reference signs between FIGS. 1 and 2 designate identical features which will not be described again.

Compared with the configuration of the device 100 shown in FIG. 1, it is the location of the meniscus 241 of the precursor of the liquid phase coating 240 that has been modified, as well as the direction of travel of the fibre 250. Indeed, the meniscus 241 is now located just below the cavity 212. In other words, the part of the reactor 220 that is present in the cavity 212 does not contain the liquid phase of the precursor 240. In addition, as indicated, the direction of flow of the fibre 250 in the device 200 shown by the arrows 233 and 234 has been changed.

In this example, the meniscus 241 is positioned so that a portion of fibre that is contiguous to the fibre segment 251 in the microwave field is also heated by thermal conduction and allows the liquid phase of the precursor of the coating 240 to evaporate (boil off) at an area 242 represented by dashes in FIG. 2. The coating precursor that has evaporated is now present in gaseous form in the portion of the reactor 220 that is free of the liquid phase 240 of coating precursor and present in the microwave field. The fibre segment 251 that is present in the microwave field is heated to a temperature sufficient to allow the gas phase precursor to deposit on the fibre segment 251 and form the coating. This technique may be similar to chemical vapour infiltration coupled with calefaction. As previously mentioned, the skilled person knows how to select the properties of the microwave field, including its frequency and/or power, to achieve the proper temperature at the surface of the fibre segment 251 to form the coating from the coating precursor.

In this example, the direction of travel is preferably that shown so that sufficient liquid phase precursor of the coating 240 is evaporated, but it is possible to travel the fibre 250 in the same direction as shown in FIG. 1. In this example, coating formation can thus be achieved at a pressure in the reactor 220 of the order of atmospheric pressure or slightly higher.

Figure 3:
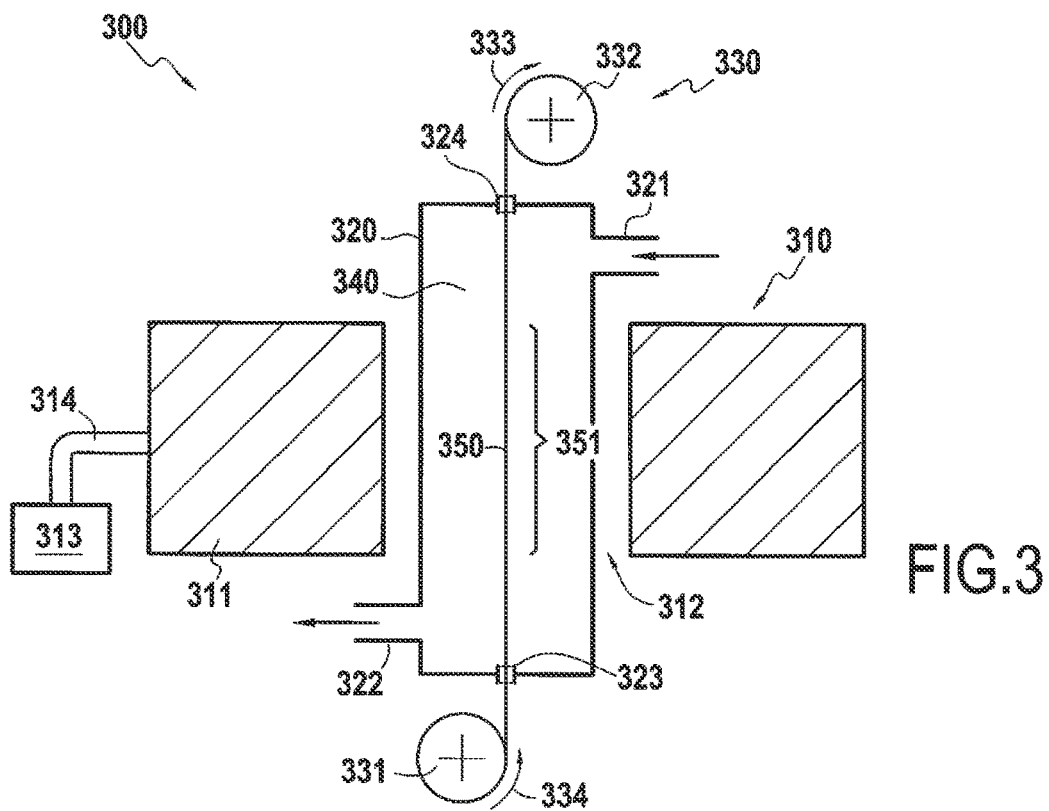
FIG. 3 shows a very schematic example of a device for carrying out a process according to a third or fourth embodiment of the invention.

FIG. 3 shows a third device 300 for carrying out a process according to a third embodiment of the invention in which the heated fibre segment is in the presence of a gas phase of the coating precursor, or according to a fourth embodiment of the invention in which the heated fibre segment is in the presence of a supercritical phase of the coating precursor. The device 300 comprises, analogously to the device 100, a microwave generator 310, a reactor 320 and a traversing device 330.

The microwave generator consists of a resonator 311 with a resonant cavity 312, the resonator 311 is connected to a wave generator 313 by a coaxial cable 314. During operation, a microwave field flows through the resonant cavity 312.

The device 300 further comprises a cylindrical-shaped reactor 320 with an inlet 321 and an outlet 322 for the coating precursor. The reactor 320 may be made of a material transparent to microwaves, for example quartz. At least part of the reactor 320 is present in the cavity 312. In the example shown, the inlet 321 and outlet 322 of the reactor 320 are located on either side of the cavity 312. The reactor 320 here contains a precursor of the gas phase or supercritical phase coating 340 which can be circulated in the reactor 320 between the inlet 321 and the outlet 322 of the reactor 320. The reactor 320 further comprises two ports 323 and 324 through which a fibre 350 can respectively enter and exit the reactor 320, the ports 323 and 324 being configured here so as not to allow the coating precursor 340 to escape from the reactor 320.

The traversing device 330 here comprises a first mandrel 331 from which the fibre 350 can be unwound, the first mandrel 331 can be a storage mandrel for the fibre 350 before it is coated, and a second mandrel 332 on which the fibre 350 can be wound once it is coated. The fibre 350 can then be circulated in the reactor 320 from the first mandrel 331 to the second mandrel 332. The traversing device 330 can be controlled by control means not shown, so as to take up the fibre 350 in the device 300 in a continuous or semi-continuous (i.e. stepwise) manner. The traversing device 330 can traverse the 350 fibre through the device 200 in both directions. In the example shown, the fibre 350 is passed from bottom to top (arrows 333 and 334), i.e. in a direction opposite to the flow of the gas phase of the coating precursor in the device 300. This particular direction of passage further increases the deposition kinetics of the coating.

In this device 300, similarly to the devices 100 and 200, the segment 351 of fibre 350 present in the microwave field is heated so that its surface reaches a temperature sufficient for the gas phase or supercritical phase precursor to deposit on the fibre segment 351 to ensure the formation of the coating. As mentioned above, the skilled person knows how to select the properties of the microwave field, including its frequency and/or power, to achieve the proper temperature at the surface of the fibre segment 351 to form the coating from the coating precursor. Depending on whether the fibre segment 351 is in the presence of a gas phase or a supercritical phase of the coating precursor, each gas phase chemical infiltration or supercritical phase chemical deposition coating formation technique can be referred to as a gas phase chemical infiltration or supercritical phase chemical deposition coating formation technique, respectively. The skilled person knows how to select the conditions, particularly temperature and pressure, of the coating precursor to ensure the formation of the coating on the fibre segment 351. An advantage of the invention in this case is that the walls of the reactor 320 are cold in comparison with reactors used in the prior art to carry out, for example, chemical vapour infiltration. Working with cold walls offers the opportunity to overcome the standard operating conditions of a conventional CVI process, and makes it possible to achieve significantly higher deposition kinetics, up to two orders of magnitude higher.

In all of the examples shown, the thickness of the coating formed on the fibre segment 151, 251, 351 depends, all else being equal, on the residence time of the fibre segment 151, 251, 351 in the microwave field in the presence of the precursor of the coating.

In all the examples shown, the coating can be an interphase coating, for example silicon carbide, boron nitride or pyrolytic carbon. For example, a pyrolytic carbon interphase can be formed using a coating precursor such as an alcohol, for example ethanol, polyalcohol or toluene. For example, a silicon carbide interphase may be formed using a coating precursor such as methyltrichlorosilane or dimethylchlorosilane. For example, a boron nitride interphase may be formed using a coating precursor such as borazine, or a mixture of $BCl_3$ and $NH_3$.

The devices 100, 200 and 300 have been presented as being capable of accommodating a single fibre 150, 250, 350. Of course, the process according to the invention can be carried out on several continuous fibres at the same time, for example by feeding the devices 100, 200 and 300 with yarns or strands comprising several fibres.

The continuous fibre coated by a process according to the invention can then be used to make a fibrous preform, for example by weaving, which can finally be densified by a matrix.

EXAMPLE

A pyrocarbon interphase is deposited on continuous silicon carbide fibres by a process according to the first embodiment of the invention, using the device 200 described above. For this purpose, a strand of Hi-Nicalon type S silicon carbide fibres with a diameter of 10 μm (average filament diameter) is used. The precursor of the coating, ethanol in the liquid phase, is placed in the reactor 220 of the device 200 as shown in FIG. 2. In the microwave generator used, the resonant cavity of the resonator has a natural frequency of the order of 2.45 GHz and is powered by 15 W. The fibre strand is passed through the device 200 at a speed of 10 mm/min. Fibres coated with a homogeneous, continuously deposited pyrocarbon interphase were obtained.

The invention claimed is:

1. A process for depositing a coating on a continuous fibre of carbon or silicon carbide from a precursor of the coating, the process comprising:
   heating a segment of the fibre in the presence of the coating precursor in a microwave field so as to bring the surface of the segment to a temperature allowing the coating to form on the segment from the coating precursor,
   wherein, during the heating step, the fibre segment is in contact with a liquid phase of the coating precursor and the coating is formed by calefaction, and wherein the coating comprises pyrolytic carbon, boron nitride or silicon carbide, and wherein the liquid phase of the precursor couples with the microwave field.

2. The process according to claim 1, wherein the coating comprises pyrolytic carbon or boron nitride.

* * * * *